United States Patent
Khoo et al.

(10) Patent No.: US 7,627,842 B1
(45) Date of Patent: Dec. 1, 2009

(54) METHOD AND SYSTEM FOR VERIFICATION OF CIRCUITS WITH ENCODED SIGNALS

(75) Inventors: Kei-Yong Khoo, San Jose, CA (US); Chih-Chang Lin, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 835 days.

(21) Appl. No.: 10/859,465

(22) Filed: Jun. 1, 2004

Related U.S. Application Data (60) Provisional application No. 60/475,814, filed on Jun. 3, 2003.

(51) Int. Cl.
*G06F 17/50* (2006.01)
(52) U.S. Cl. .................................. 716/5; 716/4
(58) Field of Classification Search .............. 716/1, 716/3–6
See application file for complete search history.

(56) References Cited

U.S. PATENT DOCUMENTS

| | | | |
|---|---|---|---|
| 5,377,122 A | 12/1994 | Werner et al. | |
| 5,493,508 A | 2/1996 | Dangelo et al. | |
| 5,519,627 A | 5/1996 | Mahmood et al. | |
| 5,553,002 A | 9/1996 | Dangelo et al. | |
| 5,657,240 A * | 8/1997 | Chakradhar et al. | 716/4 |
| 5,841,663 A | 11/1998 | Sharma et al. | |
| 5,892,687 A | 4/1999 | Moricz et al. | |
| 6,026,222 A | 2/2000 | Gupta et al. | |
| 6,026,226 A | 2/2000 | Heile et al. | |
| 6,052,524 A | 4/2000 | Pauna | |
| 6,053,947 A | 4/2000 | Parson | |
| 6,053,948 A | 4/2000 | Vaidyanathan et al. | |
| 6,056,784 A | 5/2000 | Stanion | |
| 6,086,626 A | 7/2000 | Jain et al. | |
| 6,148,436 A | 11/2000 | Wohl | |
| 6,163,876 A | 12/2000 | Ashar et al. | |
| 6,249,901 B1 | 6/2001 | Yuan et al. | |
| 6,295,627 B1 | 9/2001 | Gowni et al. | |
| 6,324,678 B1 | 11/2001 | Dangelo et al. | |
| 6,336,206 B1 | 1/2002 | Lockyear | |
| 6,360,356 B1 | 3/2002 | Eng | |
| 6,378,112 B1 | 4/2002 | Martin et al. | |
| 6,446,243 B1 | 9/2002 | Huang et al. | |
| 6,470,478 B1 | 10/2002 | Bargh et al. | |
| 6,490,717 B1 | 12/2002 | Pedersen et al. | |
| 6,505,328 B1 | 1/2003 | Van Ginneken et al. | |

(Continued)

OTHER PUBLICATIONS

"On the Complexity of VLSI Implementations and Graph Representations of Boolean Functions with Application to Integer Multiplication" Defense Advanced Research Projects Agency, ARPA Order No. 4976, Jul. 24, 1998 p. 1-21.*

(Continued)

*Primary Examiner*—Jack Chiang
*Assistant Examiner*—Binh C Tat
(74) *Attorney, Agent, or Firm*—Vista IP Law Group, LLP (57) ABSTRACT

Disclosed are techniques for performing the verification of circuits where corresponding signals in the circuits or specifications are encoded differently and/or redundancy occurs in the signals. Verification, such as logic equivalence checking of circuits, can be performed where the corresponding signals in the two circuits are encoded differently, and/or redundancy occurs in the signals.

49 Claims, 9 Drawing Sheets

U.S. PATENT DOCUMENTS

| | | | |
|---|---|---|---|
| 6,522,767 B1 * | 2/2003 | Moskowitz et al. | 382/100 |
| 6,530,073 B2 | 3/2003 | Morgan | |
| 6,567,959 B2 | 5/2003 | Levin et al. | |
| 6,574,778 B2 | 6/2003 | Chang et al. | |
| 6,591,400 B1 | 7/2003 | Yang | |
| 6,601,024 B1 | 7/2003 | Chonnad et al. | |
| 6,742,174 B1 * | 5/2004 | Chen et al. | 716/18 |
| 6,785,815 B1 * | 8/2004 | Serret-Avila et al. | 713/176 |
| 6,842,884 B2 * | 1/2005 | Lai et al. | 716/5 |
| 6,848,084 B1 | 1/2005 | Pandey et al. | |
| 6,961,854 B2 * | 11/2005 | Serret-Avila et al. | 713/176 |
| 6,993,730 B1 * | 1/2006 | Higgins et al. | 716/3 |
| 7,000,168 B2 * | 2/2006 | Kurtas et al. | 714/755 |
| 7,103,824 B2 * | 9/2006 | Halford | 714/759 |
| 2003/0005418 A1 | 1/2003 | Sridhar et al. | |
| 2003/0107595 A1 | 6/2003 | Ciolfi | |

OTHER PUBLICATIONS

Brand, D. *"Verification of Lange Synthesized Designs"*, International Conference on Computer Aided Design, Proceedings of the 1993 IEEE/ACM International Conference on Computer-Aided Design, 1993, pp. 534-537, IEEE Computer Society Press, USA.

Brand, D., Bergamaschi, R., Stok, L., *"Be Careful with Don't Cares"*, International Conference on Computer Aided Design, Proceedings of the 1995 IEEE/ACM International Conference on Computer-Aided Design, 1995, pp. 83-86, IEEE Computer Society Press, USA.

Bryant, R., *"Graph-Based Algorithms for Boolean Function Manipulation"*, IEEE Transactions on Computers, Aug. 1986, pp. 677-691, C-35(8), USA.

Bryant, R., *"On the Complexity of VLSI Implementations and Graph Representations of Boolean Functions with Application to Integer Multiplication"*, IEEE Transactions on Computers, Feb. 1991, pp. 205-213, vol. 40, Issue 2, IEEE Computer Society, USA.

Burch, J.; Clarke, E.; Long, D.; McMillan; K.; Dill, D., *"Symbolic Model Checking for Sequential Circuit Verification"*, IEEE Transactions on Computer-Aided Design of Integrated Circuits and Systems, Apr. 1994, pp. 401-424, vol. 13, No. 4, IEEE, USA.

Kuehlmann, A.; Krohm, F., *"Equivalence Checking Using Cuts and Heaps"*, Annual ACM IEEE Design Automation Conference, Proceedings of the 34$^{th}$ Annual Conference on Design Automation, 1997, pp. 263-268, ACM, USA.

Larrabee, T., *"Test Pattern Generation Using Boolean Satisfiability"*, IEEE Transactions on Computer-Aided Design, Jan. 1992, pp. 1-19, vol. 11, No. 1.

Ludden, J. et al., *"Functional Verification of the POWER4 microprocessor and POWER4 Microprocessor Systems"*, IBM Journal of Research and Development, 2002, pp. 53-76, vol. 46, No. 1, IBM, USA.

Marques-Silva, J.; Sakallah, K., *"GRASP: A Search Algorithm for Propositional Satisfiability"*, IEEE Transactions on Computers, May 1999, pp. 506-521, vol. 48, No. 5, IEEE, USA.

Malley, C.; Dieudonné, M., *"Logic Verification Methodology for PowerPC™ Microprocessors"*, Annual ACM IEEE Design Automation Conference, Proceedings of the 32$^{nd}$ ACM/IEEE Conference on Design Automation, 1995, pp. 234-240, ACM Press, USA.

Moskewicz. S.; Madigan, C.; Zhao, Y.; Zhang, L.; Malik, S., *"Chaff: Engineering and Efficient SAT Solver"*; Proceedings of the 38th Conference on Design Automation (DAC '2001), 2001, pp. 530-535, ACM Press, USA.

Pawlovsky, A.; Naito, S., *"Verification of Register Transfer Level (RTL) Designs"*, IEICE Transactions on Information and Systems, 1992, pp. 785-791; vol. E75-D, No. 6, IEEE.

Stoffel, D.; Kunz, W., *"Logic Equivalence Checking by Optimization Techniques"*, Proceedings of the International Workshop on Computer-Aided Design, Test, and Evaluation for Dependability, Jul. 1996, pp. 85-90, IEEE, Peking, China.

Vakilotojar, V.; Beerel, P., *"RTL Verification of Timed Asynchronous and Heterogeneous Systems Using Symbolic Model Checking"*, Integration, the VLSI Journal, Dec. 1997, pp. 19-35, vol. 24 Issue 1, Elsevier Science Publishers B. V., Amsterdam, The Netherlands.

Weste, N.; Eshraghian, K., *"Principles of CMOS VLSI Design"*, A Systems Perspective, Second Edition, 1993, pp. 381-511, Addison-Wesley Publishing Company, USA.

Zhang, H., *"SATO: An Efficient Propositional Prover"*, Lecture Notes In Computer Science; Proceedings of the 14th International Conference on Automated Deduction, 1997, pp. 272-275, vol. 1249, Springer-Verlag, London, UK.

Brand, D. "Verification of Large Synthesized Designs" Proceedings of the 1993 IEEE/ACM International Conference on Computer-Aided Design (ICCAD-93), Digest of Technical Papers, Santa Clara, California, Nov. 7-11, 1993, pp. 534-537.

Brand, D. et al. "Be Careful with Don't Cares" Proceedings of the 1995 IEEE/ACM International Conference on Computer-Aided Design (ICCAS '95), Santa Clara, CA, Nov. 5-9, 1995, pp. 83-86.

Bryant, R.E. "Graph-Based Algorithms for Boolean Function Manipulation" Transactions on Computers, Aug. 1986, vol. C-35, No. 8, pp. 677-691.

Bryant, R.E. "On the Complexity of VLSI Implementations and Graph Representations of Boolean Functions with Application to Integer Multiplication" IEEE Transactions on Computer, Feb. 1991, vol. 40, No. 2, pp. 205-213.

Burch, J.R. et al. "Symbolic Model Checking for Sequential Circuit Verification" IEEE Transactions on Computer-Aided Design of Integrated Circuits and Systems, Apr. 1994, vol. 13, No. 4, pp. 401-424.

Kuehlmann, A. et al. "Equivalence Checking Using Cuts and Heaps" Proceedings of the 34th Annual ACM/IEEE Design Automation Conference (DAC 97), Anaheim, California, Jun. 9-13, 1997, pp. 263-268.

Larrabee, T. "Test Pattern Generation Using Boolean Satisfiability" IEEE Transactions on Computer-Aided Design, Jan. 1992, vol. 11, No. 1, pp. 4-15.

Ludden, J.M. et al. "Functional Verification of the POWER4 Microprocessor and POWER4 Multiprocessor Systerm" IBM J. Res. & Dev., Jan. 2002, vol. 46, No. 1, pp. 53-76.

Malley, C.H. et al. "Logic Verification Methodology for PowerPC™ Microprocessors" Proceedings of the 32nd ACM/IEEE Design Automation Conference (DAC '95), San Francisco, CA, Jun. 12-16, 1995, pp. 234-240.

Marques-Silva, J.P. et al. "GRASP: A Search Algorithm for Propositional Satisfiability" IEEE Transactions on Computers, May 1999, vol. 48, No. 5, pp. 506-521.

Moskewicz, M.W. et al. "Chaff: Engineering an Efficient SAT Solver" Proceedings of the 2001 Design Automation Conference, Las Vegas, NV, Jun. 18-22, 2001, pp. 530-535.

Pawlovsky, A.P. et al. "Verification of Register Transfer Level (RTL) Designs" Proceedings of the Pacific Rim International Symposium on Fault Tolerant Systems (PRFTS '91), Kawasaki, Japan, Sep. 26-27, 1991, pp. 30-35.

Stoffel, D. et al. "Logic Equivalence Checking by Optimization Techniques" Proceedings of the International Workshop on CAD, Test and Evaluation of Dependability, Beijing, China, Jul. 2-3, 1996, pp. 85-90.

Weste, N.H.E. et al. "Principles of CMOS VLSI Design. A Systems Perspective" 2nd Ed., Copyright 1993 by AT&T, Title page copyright page, Chapters 6 and 7 (pp. 381-511), Addison-Wesley Publishing Company, Reading, Massachusetts.

Zhang, H. "SATO: An Efficient Propositional Prover" located in Lecture Notes in Computer Science, Copyright 1997, vol. 1249, pp. 272-275, Springer Berlin/Heidelberg.

\* cited by examiner

SERIAL INSERTION OF DECODING AND ENCODING LOGIC

ORIGINAL CONNECTION

NEW CONNECTION

Fig. 4

SERIAL INSERTION OF DECODING AND ENCODING LOGIC

ORIGINAL CONNECTION

EXAMPLE OF DECODING AND ENCODING LOGIC FOR CARRY-SAVE SIGNAL

METHOD AND SYSTEM FOR VERIFICATION OF CIRCUITS WITH ENCODED SIGNALS

CROSS-REFERENCE TO RELATED APPLICATIONS

This application claims the benefit of U.S. Provisional Application Ser. No. 60/475,814, filed Jun. 3, 2003, which is hereby incorporated by reference in its entirety.

BACKGROUND OF THE INVENTION

In the verification of digital circuits, signals in the circuits are "compared" in some manner in order to draw a conclusion on the "correctness" of one or more properties of the circuits. For example, to determine if two circuits with identical state encoding will behave identically under some excitations, one can simply compare the simulated values of the corresponding state-points in the two circuits when the circuits are subjected to the same excitations. Alternatively, one can show that the two circuits will behave identically under all possible excitations with a formal methodology wherein the functions of the corresponding state-points in the two circuits are proved to be functionally equivalent. This method is known as formal equivalence checking and it is in the category of verification methods known as formal verification. In this case, the circuits are partitioned into combinational logics by the key-points in the circuit, examples of which include the sequential elements in the circuits, such as flip-flop, registers, and latches, and primarily inputs and outputs of the circuits. That is, every combinational logic cone in the circuit is bounded by key-points. The key-points in the two circuits to be compared for equivalence are corresponded by means of a key-point mapping, which in the simplest case, corresponds, or maps, one key-point from a first circuit to one key-point from a second circuit. If the two circuits are equivalent, then every corresponding key-point at the output of logic cones in the two circuits will realize the same combinational logic function with respect to the corresponded key-points at the input of the logic cones.

In yet another example, a circuit can be verified against a specification wherein the specification refers to some signals in the circuit to be verified. An example specification might say "the signal called S in the circuit is always zero." In this example, the referenced signal in the circuit is "S" and "is always zero" is the condition (or property) to be verified. This type of verification is generally called property checking.

In the preceding examples, verification is dependent on the correspondences of signals (for example, between two circuits to be verified, or between a specification and a circuit, etc.) to be verified. In addition, such correspondence information can also be used in formal verification even if the signals are not explicitly being compared as part of the verification. For example, an efficient method in comparing the functions of two signals in two circuits is to first determine the functions of some intermediate signals. Such intermediate signals, known as cut-points, if they correspond between the two circuits, can be used to simplify the comparison of the final functions significantly.

Finding correspondence between two circuits is problem having a wide applicability to many fundamental problems in circuit design, synthesis, and verification. Many methods can be either fully automated, requiring information embedded in the circuits, or can require user intervention, and can be implemented in many circuit design and verification tools. However, these can require the corresponding signals to be identical. In some instances, ad hoc solutions exist to handle specific special cases whose applicability is restricted. Some embodiments of the present invention describe techniques for performing the verification of circuits where signals in the circuits or specifications are encoded such that a direct correspondence may be impossible or incorrect.

BRIEF SUMMARY OF THE INVENTION

Some embodiments can be applied to the problem of equivalence checking of two or more circuits. Some embodiments can be readily applied to other problems, such as those that are mentioned above, including, for example, verification of circuits against specifications, and functional equivalence between state points. Some embodiments of the present invention describe techniques for performing the verification of circuits where signals in the circuits or specifications are encoded such that a direct correspondence may be impossible or incorrect.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION OF THE INVENTION

Figure 1:
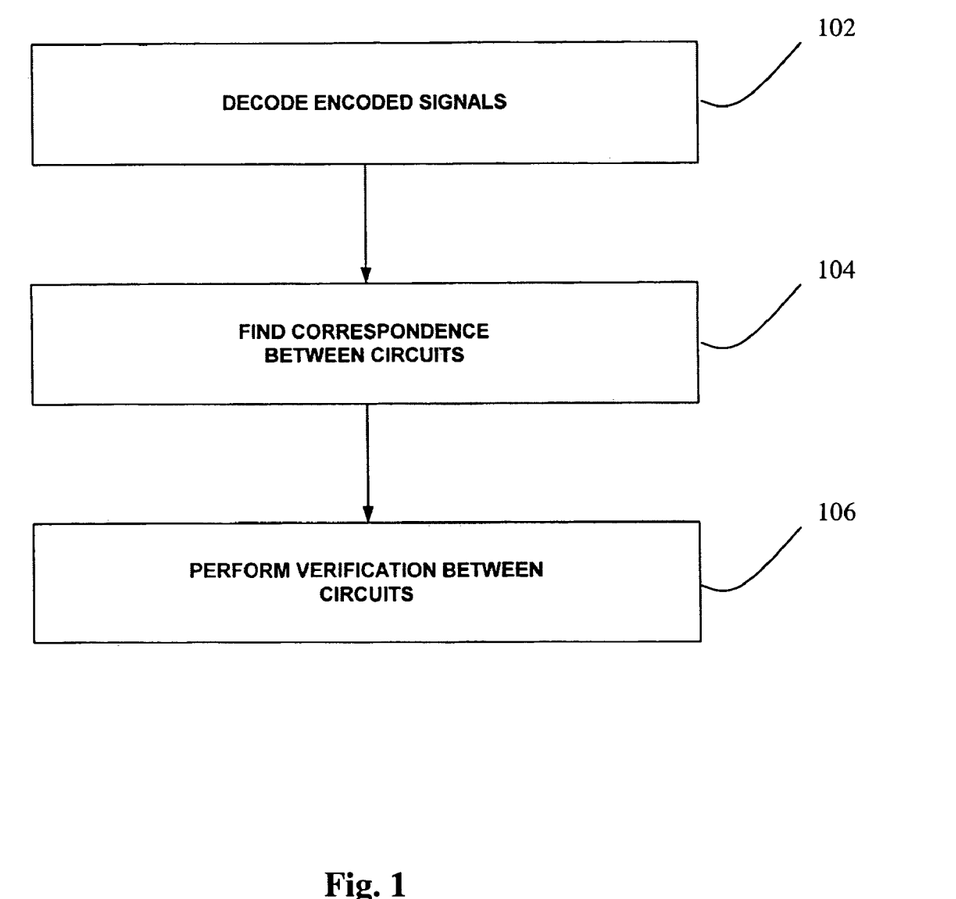
FIG. 1 shows an example of a method for verifying a circuit with encoded signals.

FIG. 1 shows an example of a method for verifying a circuit with encoded signals. Encoded signals are decoded (102). Correspondence is found between circuits (104). Verification is performed between the circuits (106). For example, if verification, such as equivalence checking, is performed between two circuits, one or both of the circuits undergoing verification may have encoded signals decoded to aid the process of finding correspondence between the two circuits.

Figure 2:
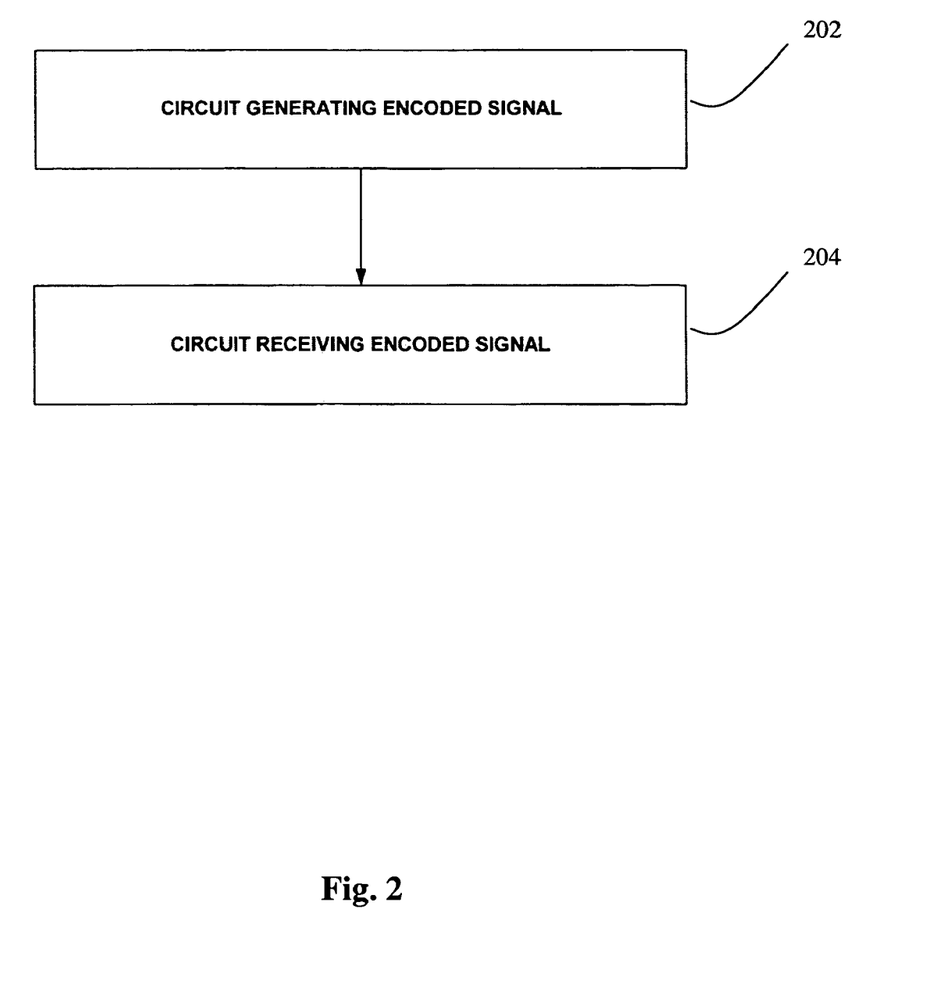
FIG. 2 shows circuits generating and receiving encoded signals.

FIG. 2 shows circuits generating and receiving encoded signals. Both the circuits generating (202) and receiving (204) encoded signals can be part of a larger circuit which undergoes verification with another larger circuit.

Figure 3:
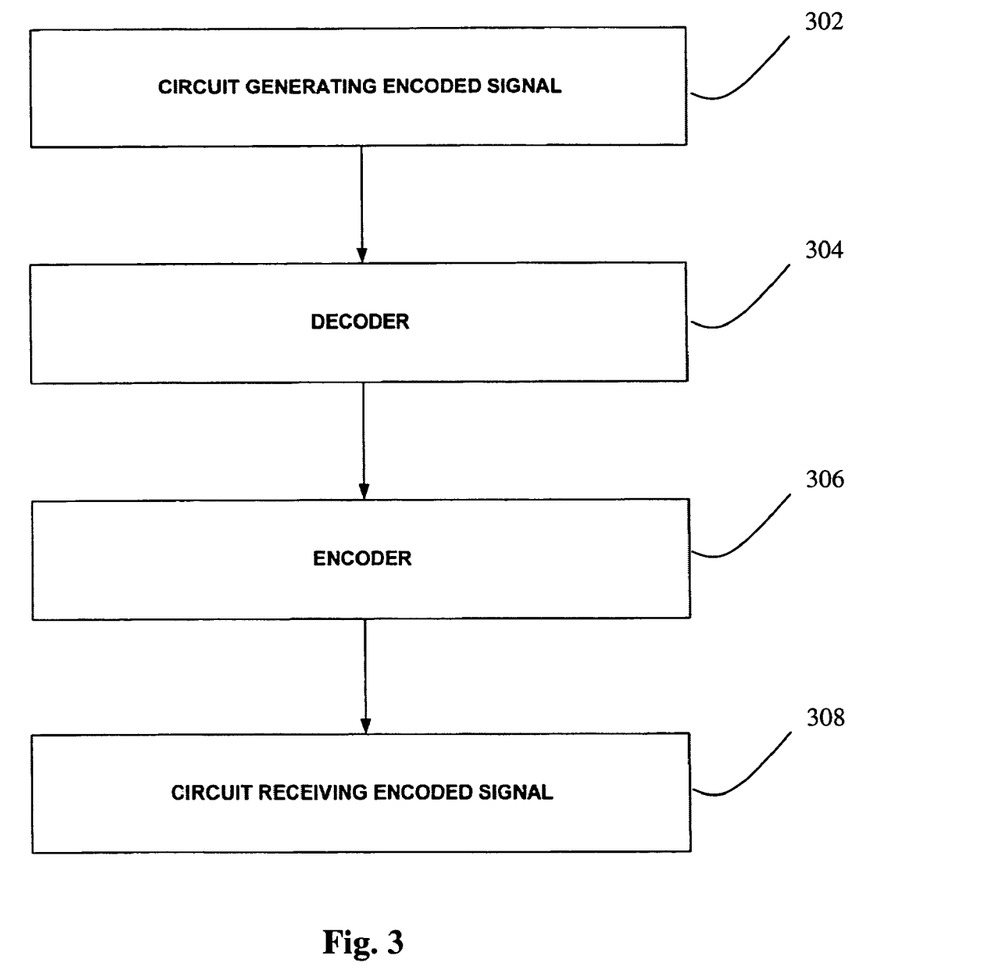
FIG. 3 shows the decoding and encoding of encoded signals between the circuits of FIG. 2.

FIG. 3 shows the decoding and encoding of encoded signals between the circuits of FIG. 2. The circuit generating encoded signals (302) sends the encoded signals to a decoder. The decoder turns the encoded signals into decoded signals (304). At this point, correspondences are most easily found between this circuitry and other circuitry. The decoded signals are received by an encoder, which generates encoded signals (306). The encoded signals are received by the circuit receiving the encoded signal (308). Both the circuits generating and receiving encoded signals can be part of a larger circuit which undergoes verification with another larger circuit. The other larger circuit undergoing verification may also have an encoder and a decoder inserted between a circuit generating encoded signals and a circuit receiving encoded signals.

In some cases, N-bit signal $X=\{x_{N-1}, x_{N-2}, \ldots, x_0\}$ is implemented as an encoded M-bit signal $Y=\{y_{M-1}, Y_{M-2}, \ldots, y_0\}$ whose encoding is given by the encoding function $f X \rightarrow Y$ that maps a pattern of the signal X to a pattern of the signal Y. The encoding can have properties such as redundancy and/or completeness. If $f$ is a one-to-many mapping, that is, there exists at least a pattern in X where it can be encoded as more than one possible pattern in Y, then $f$ implements a redundant encoding (or the signal Y is a redundant code). If the number of possible patterns in Y is less than $2^M$, then the encoding is incomplete, i.e., not every possible value of Y is a valid encoding of X.

One method of describing the encoding is to explicitly list out all the possible mappings in the encoding function as a table. For example, the following table shows a simple encoding of a single bit signal {x0} to a "differential" two-bit {y1, y0} signals.

| x0 | y1 | y0 |
|---|---|---|
| 0 | 0 | 0 |
| 0 | 1 | 1 |
| 1 | 0 | 1 |
| 1 | 1 | 0 |

Each row in the table represents a mapping from a pattern in signal X to a pattern in signal Y. The order in which the patterns are listed in the table is not important. For example, given a signal of {0}, it can be encoded to either {0,0} or {1,1}. Since the signal {0} can be encoded to more than one pattern, this encoding is redundant. This encoding is complete since all possible values of {y1, y0} appear in the table. However, the following encoding, while redundant as above, is incomplete since one of the possible {1,1} does not exists in the table. That is, there is no possible pattern in X that can be encoded into a pattern in Y as (1, 1}.

| x0 | y1 | y0 |
|---|---|---|
| 0 | 0 | 0 |
| 0 | 1 | 1 |
| 1 | 0 | 1 |

Using the encoding shown above, we can now illustrate the difficulty of comparing encoded signals with three scenarios.

In the first scenario, a comparison is performed between the Boolean functions of an encoded signal and a decoded signal. This situation commonly arises in the comparison between a specification (either as a circuit or a property) with an implementation where the specification is described using the decoded pattern, and the implementation is described using the encoded signal. With the encoding, a direct comparison of the Boolean function is not possible since the two signals {x0} and {y1, y0} do not correspond to begin with (one being a one-bit Boolean function and the other being a two-bit Boolean function).

In the second scenario, a comparison is performed between the Boolean functions of two encoded signals using the same encoding function. While there may be no problem in finding correspondence between the two signals since they are of the same size, the Boolean functions of the two encoded signals need not be identical if the encoding is a redundant encoding. For example, if we compare the two encoded signals {1,1} versus {0,0}, while their Boolean functions are not identical, the two patterns in fact represent the same decoded value of {0}.

In the final scenario, suppose a comparison is performed between Boolean functions of two signals encoded using different encoding functions. Clearly, there would be a problem in both finding correspondence between the signals as well as comparing their Boolean functions.

Figure 4:
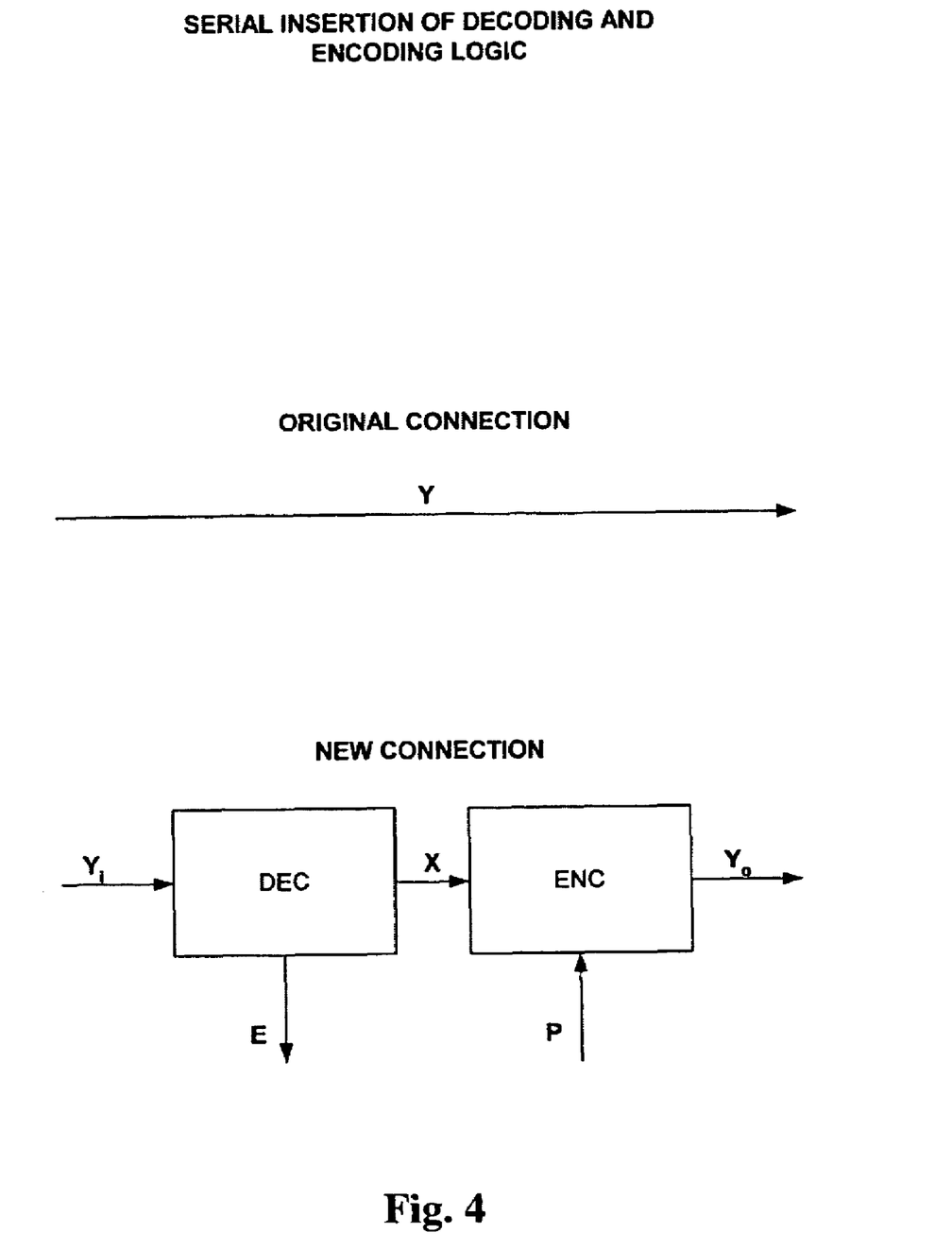
FIG. 4 shows an example of replacing an encoded signal connection with a decoder and encoder.

Some embodiments use logic to both recreate the original decoded as well as to re-encode the signal to guarantee the correctness of the implementation using the encoded signals. In some embodiments wherever references to the original decoded signal X is needed, a block of logic can be inserted serially into the encoded signal Y as shown in FIG. 4. The intervening logic block includes a block of decoding logic DEC in series with a block of encoding logic ENC, where the interface between ENC and DEC reveals the original decoded signal X. Notice that this insertion of logic can be done explicitly by a direct and permanent modification to the circuits, through a temporary modification of the circuits, or through another manner in which the effects of the logic are realized (e.g., output undisturbed relative to input, and original decoded signal revealed at some point).

The decoding logic DEC realizes the mapping from the encoded signal pattern to the decoded signal pattern. In addition, if the encoding function $f$ is incomplete, then there is a possibility that the encoded signal is in error. In such a case, the error signal E is asserted. Notice that if the encoding function is complete, then the error signal E is unlikely be asserted can therefore be omitted. In one example of using the error signal, in formal equivalence checking, it can be unnecessary to find a correspondence between this error signal and the circuits undergoing verification. Instead, the error signal can be tested for the possibility of asserting the error value. For example, if a non-zero error signal indicates an error, and a zero signal indicates no error, then if the error signal is proved to be a constant zero value, then the error condition cannot happen in the circuit and the encoding process (in the circuits to be verified), is not in error.

The encoding logic ENC realizes the mapping from the decoded signal pattern to the encoded signal pattern. In addition, if the encoding function $f$ is redundant, then a single input pattern to ENC can be mapped to multiple patterns at the output of ENC. Therefore, ENC has an additional pseudo input that can be used to select, for example, all possible output patterns (such as in any order, with or without overlapping). In some embodiments, if all possible patterns are applied to the one or more pseudo inputs, then all possible mappings specified in the encoding function and/or only those mappings specified in the encoding function, are exercised. In formal equivalence checking, a correspondence does have to be found between these pseudo inputs and the circuits undergoing verification. These pseudo inputs can become "free-variables" in the comparison, and a result indicating the equivalency between the two circuits can imply that the two circuits are equivalent under any pseudo input pattern.

The logic to decode and/or encode the signal can be performed using a logic function, addition function or look-up table from an encoding table. The logic may be embodied as software, hardware, or any combination of software and hardware.

In this next section, a description is provided of an embodiment of the invention as part of a system that is used to perform equivalence checking of arithmetic values represented using carry-save signals. An arithmetic value is most compactly implemented in binary logic with a vector including an ordered list of N binary bits $\{b_N, b_{N-1}, \ldots, b_0\}$ whose arithmetic value is given by $$b_N 2^N + b_{N-1} 2^{N-1} + \ldots + b_0$$

For example, the binary vector $\{0,1,1,0\}$ represents the arithmetic value of 6. For a carry-save signal, two vectors are used to represent one arithmetic value. The two vectors, typically called the sum vector $S=\{S_N, S_{N-1}, \ldots, S_0\}$ and the carry vector $C=\{C_N, C_{N-1}, \ldots, C_0\}$, represents the value obtained by the addition of the arithmetic values of the sum and the carry vector, respectively. That is, the unsigned arithmetic value of (S,C) is:

$$c_N 2^N + c_{N-1} 2^{N-1} + \ldots + c_0 + s_N 2^N + s_{N-1} 2^{N-1} + \ldots + s_0$$

or more compactly as $$S+C$$

For example, given the carry-save vectors $C=\{0,1,1,0\}$ and $S=\{1,0,0,0\}$, the value of X is 14. Notice that the encoded signals have twice the number of bits than the original signal. The following table gives the encoding function for a two bit vector $\{y1, y0\}$ to the carry-save signals of $S=\{y11, y01\}$ and $C=\{y10, y00\}$.

| x1 | x0 | y11 | y10 | y01 | y00 |
|----|----|----|----|----|----|
| 0 | 0 | 0 | 0 | 0 | 0 |
| 0 | 1 | 0 | 0 | 0 | 1 |
| 0 | 1 | 0 | 0 | 1 | 0 |
| 1 | 0 | 0 | 0 | 1 | 1 |
| 1 | 0 | 0 | 1 | 0 | 0 |
| 1 | 1 | 0 | 1 | 0 | 1 |
| 1 | 1 | 0 | 1 | 1 | 0 |
| 0 | 0 | 0 | 1 | 1 | 1 |
| 1 | 0 | 1 | 0 | 0 | 0 |
| 1 | 1 | 1 | 0 | 0 | 1 |
| 1 | 1 | 1 | 0 | 1 | 0 |
| 0 | 0 | 1 | 0 | 1 | 1 |
| 0 | 0 | 1 | 1 | 0 | 0 |
| 0 | 1 | 1 | 1 | 0 | 1 |
| 0 | 1 | 1 | 1 | 1 | 0 |
| 1 | 0 | 1 | 1 | 1 | 1 |

This encoding is a redundant encoding since, for example, the value $\{0,0\}$ can be encoded as $(\{0,0\}, \{0,0\})$ or $(\{0,1\}, \{1,1\})$. In addition, the encoding is complete since all 16 possible values of $(\{y11, y01\}, \{y10, y00\})$ appears in the table.

For the DEC logic, since the encoding function is complete, it can be realized as a look-up table from the encoding table, or more simply as an addition.

For the ENC logic, since the encoding function is redundant, we must provide for additional pseudo inputs so that the ENC logic can output all possible patterns. A simple way to achieve this is to generate the carry-save vectors as (X-P, P)

where P is the N-bit pseudo input.

Figure 5:
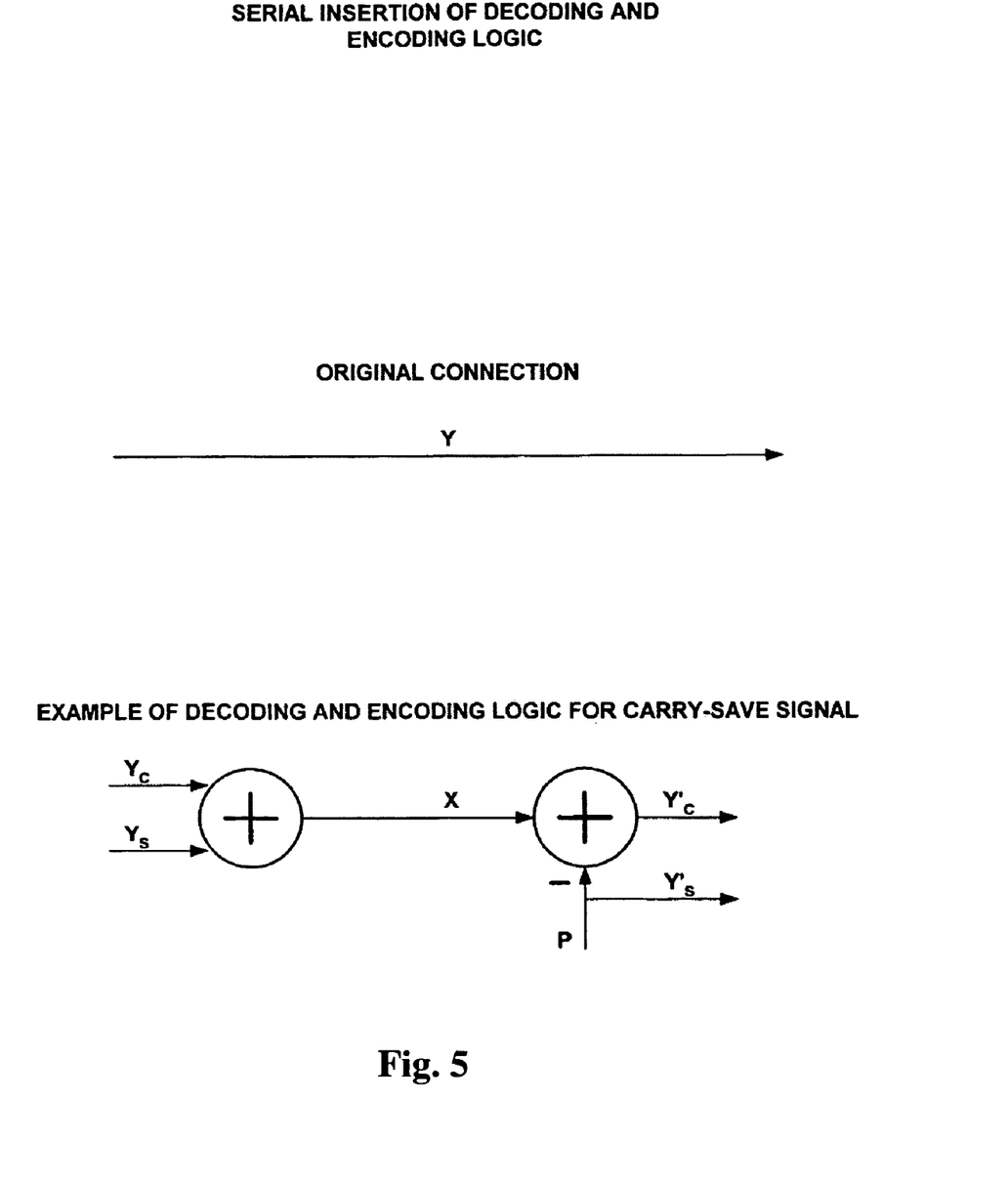
FIG. 5 shows an example of FIG. 4 applied to a carry-save signal.

The DEC and ENC logic for the carry-save signals are shown in FIG. 5, where each line in the figure can represent, for example, an N bit vector. With the logic described, correspondence can be found with the decoded signals. In the framework of formal equivalence checking, where the key-points between two circuits to be compare for equivalence are corresponded (or mapped), the pseudo input can be left uncorresponded (unmapped), and when the corresponded key-points in the circuit can be proven to be equivalent (i.e., the pseudo-inputs are redundant), then the circuits can be formally shown to be equivalent.

Figure 6:
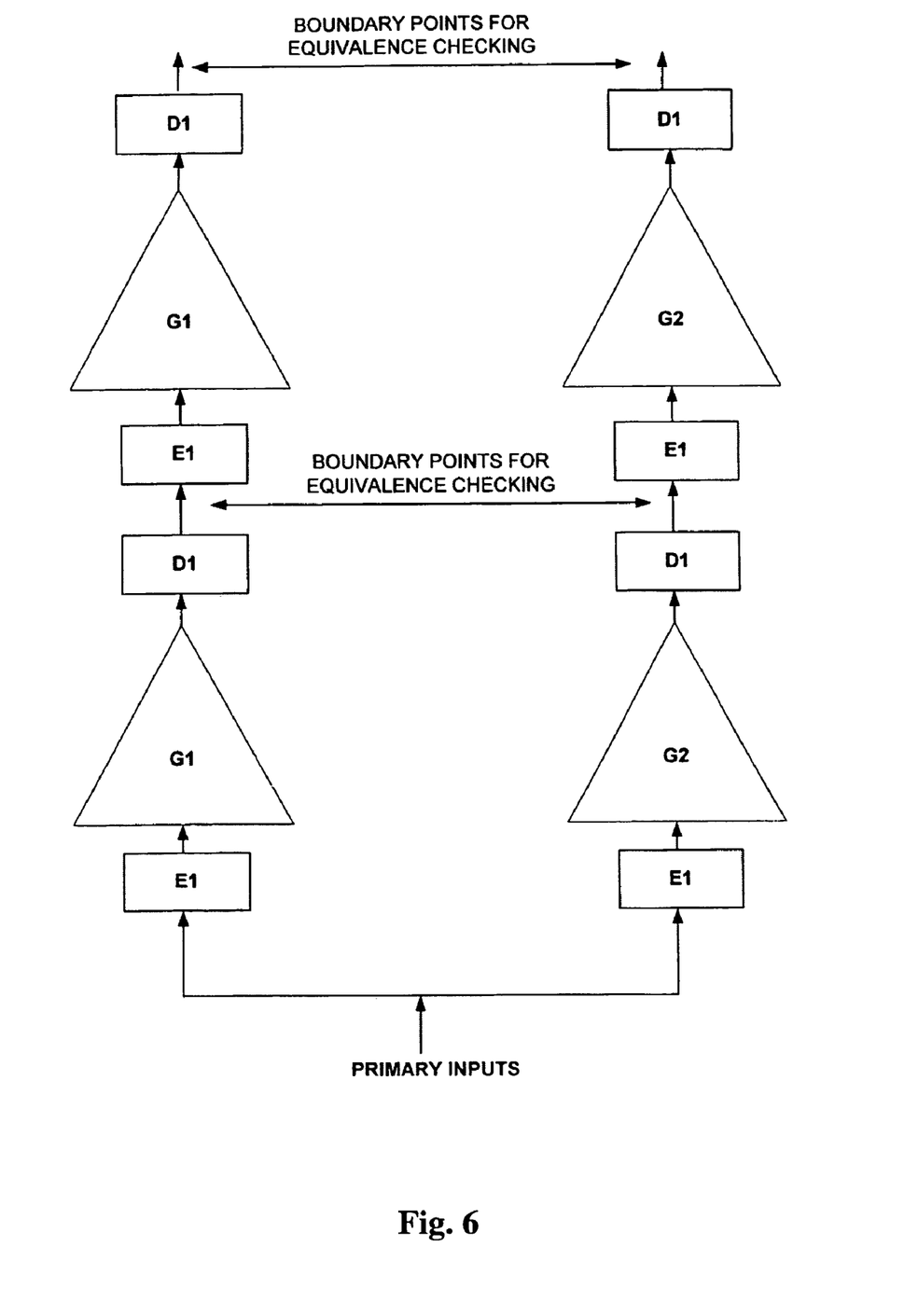
FIG. 6 shows an example of an application to equivalence checking.

Some embodiments verify digital circuits including carry-save signals. The carry-save signals in the circuits are first identified by a user, automatically by a tool (e.g., implied by the circuit connections), and/or another way, such that the signal and its encoding function can be determined. The decoding logic and the encoding logic are inserted into the paths of the carry-save signals (either explicitly by an actual modification to the circuit representation, implicitly, and/or by another manner such, that the effects of the encoding and decoding logics are realized and the signals created by the decoding and encoding logic are revealed. Correspondence can be found between the decoded signals, revealed by the decoding logic, of the circuits to be verified. The pseudo signals produced by the decoding logics can be left as free-variables to the formal equivalence checking algorithms. With correspondences found between key-points (e.g., boundary points) in the circuits, the desired property can then be verified FIG. 6 illustrates an example with equivalence checking, where circuits with combinational circuits bounded by the corresponding boundary points can be corresponded. In this figure, G1 and G2 represent the logic cones in the two circuits to be compared for equivalence. E1 and D1 are the encoder and decoder, respectively. Typically, the encoding and decoding function, when needed, are identical for each pair of corresponding points (boundary points in the figure) between the two circuits. Different encoding and decoding functions can be used at different places in the circuits. In this example, the inputs to G1 and G2 can only be corresponded at the inputs to the encoders, and the outputs of G1 and G2 can only be corresponded at the outputs from decoders. Notice that for equivalence checking, the boundary points can be used as key-points that partition the circuits into logic cones that can be individually verified for functional equivalence.

Figure 7:
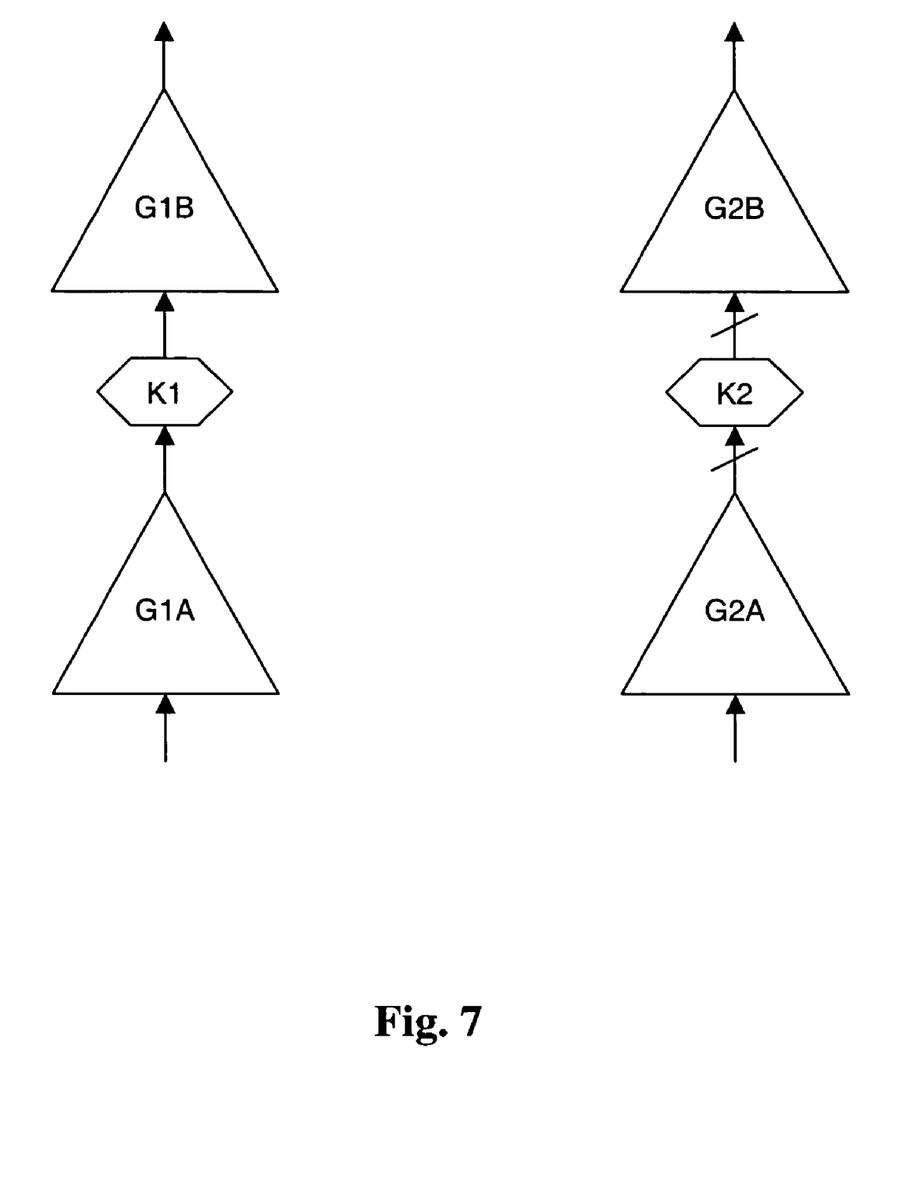
FIG. 7 shows an example problem of applying equivalence checking to circuits where one has keypoints realized using carry-save representation.

FIG. 7 further illustrates FIG. 6 as applied to the problem of equivalence checking of circuits with one using carry-save representation. In this figure, the two key-points in the two circuits, K1 between logic cone G1A and G1B, and K2 between logic cone G2A and G2B, realize the same arithmetic value. However, the output from G2A and input to G2B are realized with carry-save representations (represented with a slash mark across each carry-save represented signal line in the figure). Therefore, equivalence cannot be applied directly since K1 and K2 cannot be corresponded as K2 has twice the number of signals as K1.

Figure 8:
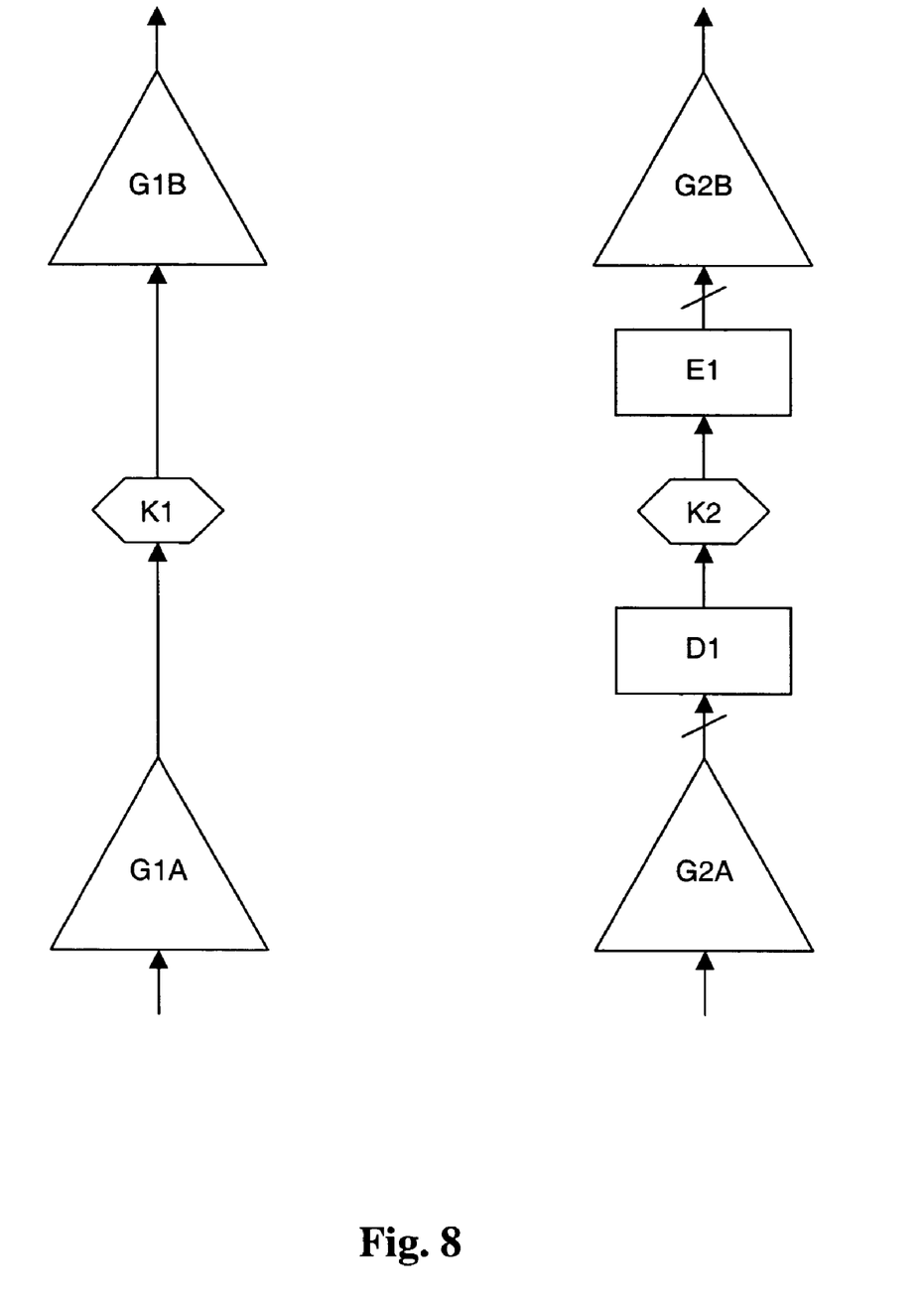
FIG. 8 shows a method that enables the equivalence checking of carry-save signals in the example in FIG. 7.

However, by inserting the decoding and encoding function, D1 and E1, respectively, as illustrated in FIG. 8, the key-point K2 now can be corresponded with K1 and equivalence checking can proceed. Notice that the encoding function E1 has unmapped pseudo inputs that ensure that logic errors in G2B can be correctly found during equivalence checking.

SYSTEM ARCHITECTURE OVERVIEW

Figure 9:
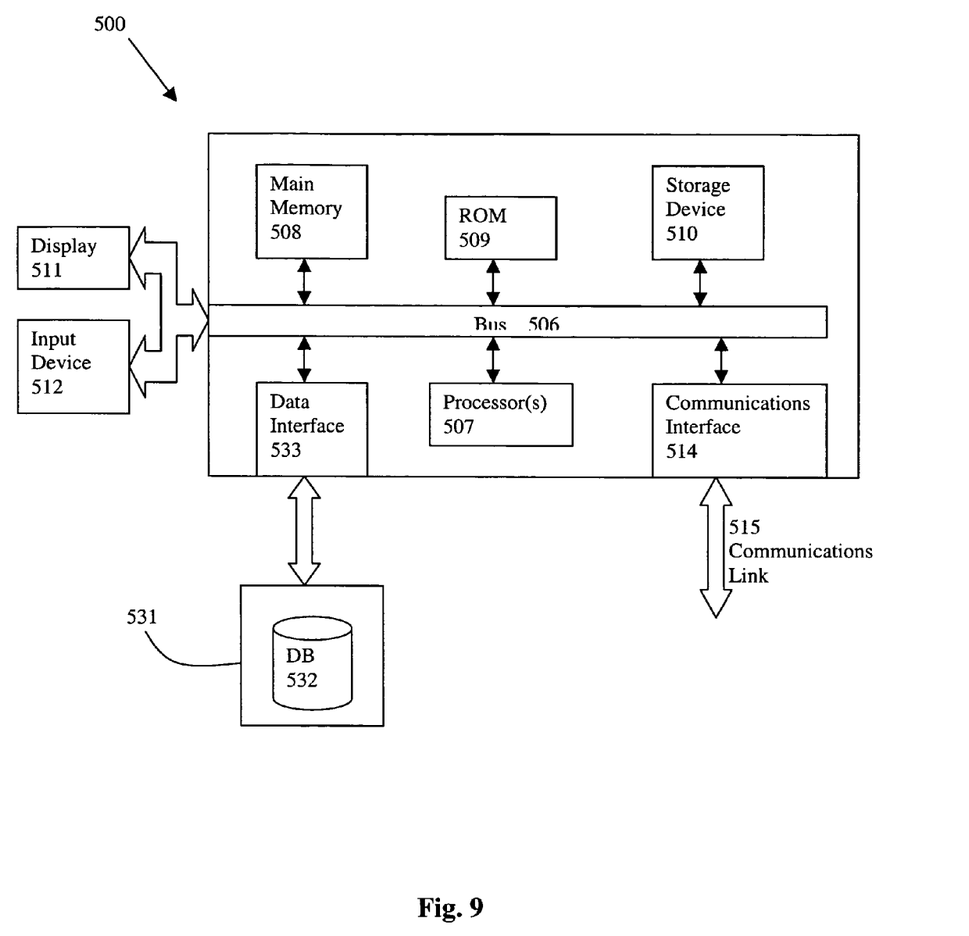
FIG. 9 illustrates an example computing architecture with which the invention may be implemented.

FIG. 9 is a block diagram of an illustrative computing system 500 suitable for implementing an embodiment of the present invention. Computer system 500 includes a bus 502 or other communication mechanism for communicating information, which interconnects subsystems and devices, such as processor 504, system memory 506 (e.g., RAM), static storage device 508 (e.g., ROM), disk drive 510 (e.g., magnetic or optical), communication interface 512 (e.g., modem or ethernet card), display 514 (e.g., CRT or LCD), input device 516 (e.g., keyboard), and cursor control 518 (e.g., mouse or trackball).

According to one embodiment of the invention, computer system 500 performs specific operations by processor 504 executing one or more sequences of one or more instructions contained in system memory 506. Such instructions may be read into system memory 506 from another computer readable/usable medium, such as static storage device 508 or disk drive 510. In alternative embodiments, hard-wired circuitry may be used in place of or in combination with software instructions to implement the invention.

The term "computer readable medium" or "computer usable medium" as used herein refers to any medium that participates in providing instructions to processor 504 for execution. Such a medium may take many forms, including but not limited to, non-volatile media, volatile media, and transmission media. Non-volatile media includes, for example, optical or magnetic disks, such as disk drive 510. Volatile media includes dynamic memory, such as system memory 506. Transmission media includes coaxial cables, copper wire, and fiber optics, including wires that comprise bus 502. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 500. According to other embodiments of the invention, two or more computer systems 500 coupled by communication link 520 (e.g., LAN, PTSN, or wireless network) may perform the sequence of instructions required to practice the invention in coordination with one another.

Computer system 500 may transmit and receive messages, data, and instructions, including program, i.e., application code, through communication link 520 and communication interface 512. Received program code may be executed by processor 504 as it is received, and/or stored in disk drive 510, or other non-volatile storage for later execution.

While the invention may be practiced as computer instructions to practice a method, it is noted that the method of the invention may be embodied as logic that can be implemented using software, hardware, or any combination of software and hardware.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for verifying a circuit design, the circuit design having a portion corresponds to an encoded carry-save signal, comprising:
    decoding by a decoder the encoded carry-save signal to produce a decoded carry-save signal;
    determining a correspondence between the decoded carry-save signal of the circuit design and a second signal of a second circuit design;
    comparing by a processor the decoded carry-save signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics; and
    storing the decoded carry-save signal in a volatile or non-volatile computer readable medium or displaying the decoded carry-save signal on a display device.

2. The method of claim 1 in which two vectors are used to represent one arithmetic value for the encoded carry-save signal.

3. The method of claim 1 in which the act of decoding the encoded carry-save signal is performed using a logic function, addition function or look-up table from an encoding table.

4. The method of claim 1 in which the decoded carry-save signal is re-encoded.

5. The method of claim 4 in which one or more pseudo inputs are employed to perform the action of re-encoding the decoded carry-save signal.

6. The method of claim 4 in which the re-encoded signal is represented by two vectors.

7. The method of claim 6, further comprising:
    generating carry-save vectors as (X-P, P) where P is an N-bit pseudo input, where X-P and P are the two vectors, and X is the decoded carry-save signal.

8. The method of claim 5 in which the one or more pseudo inputs are unmapped.

9. The method of claim 8 in which the method is performed in the framework of formal equivalence checking.

10. The method of claim 9 in which circuits are shown to be formally shown to be equivalent when key-points in the circuits can be proven to be equivalent when the one or more pseudo-inputs are redundant.

11. The method of claim 1 further comprising:
    identifying the encoded carry-save signal either automatically or manually by a user.

12. The method of claim 1 in which correspondence is identified between the decoded signal of the circuit design to be verified.

13. The method of claim 12 in which correspondences found between key-points in the circuit design.

14. The method of claim 13 in which the key-points comprise boundary points.

15. The method of claim 1 in which pseudo signals produced by decoding logic is left as free-variables to formal checking algorithms.

16. The method of claim 1 in which the second signal is another encoded signal that is decoded before performing the act of comparing.

17. A computer implemented method for verifying a circuit design, the circuit design having a portion corresponds to an encoded signal, comprising:
    decoding by a decoder the encoded signal to produce a decoded signal;
    determining by a processor a correspondence between the decoded signal of the circuit design and a second signal of a second circuit design;
    comparing the decoded signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics; and
    storing the decoded signal in a volatile or non-volatile computer readable medium or displaying the decoded signal on a display device.

18. The method of claim 17 in which the act of decoding the encoded signal is performed using a logic function, addition function or a look-up table from an encoding table.

19. The method of claim 17 in which the act of decoding realizes a mapping from an encoded signal pattern to a decoded signal pattern.

20. The method of claim 17 in which a determination is made whether the encoded signal is in error.

21. The method of claim 20 in which a completed encoding function indicates no error.

22. The method of claim 17 in which the decoded signal is re-encoded.

23. The method of claim 22 in which one or more pseudo inputs are employed to perform the action of re-encoding the decoded signal.

24. The method of claim 23 in which the one or more pseudo inputs are unmapped.

25. The method of claim 24 in which the method is performed in the framework of formal equivalence checking.

26. The method of claim 25 in which circuits are shown to be formally shown to be equivalent when key-points in the circuits can be proven to be equivalent when the one or more pseudo-inputs are redundant.

27. The method of claim 22 in which encoding logic is employed to realizes a mapping from a decoded signal pattern to an encoded signal pattern.

28. The method of claim 27 in which, if an encoding function $f$ is redundant, a single input pattern to the encoding logic is mapped to multiple patterns at an output of the encoding logic.

29. The method of claim 27 in which the encoding logic has one or more pseudo inputs that are used to select possible output patterns.

30. The method of claim 29 in which all possible patterns are applied to the one or more pseudo inputs.

31. The method of claim 17 in which verification is performed of the circuit design against a specification.

32. The method of claim 20 in which the modification is performed as either a permanent or temporary modification.

33. The method of claim 17 in which correspondence is identified between the decoded signal of the circuit design to be verified.

34. The method of claim 33 in which correspondences found between key-points in the circuit design.

35. The method of claim 34 in which the key-points comprise boundary points.

36. The method of claim 17 in which pseudo signals produced by decoding logic is left as free-variables to formal checking algorithms.

37. The method of claim 17 in which the second signal is another encoded signal that is decoded before performing the act of comparing.

38. The method of claim 17 in which multiple nested levels of encoding and decoding are performed to verify the circuit design.

39. The method of claim 17 in which a comparison is performed between one or more Boolean functions of the encoded signal and the decoded signal.

40. The method of claim 17 in which a comparison is performed between one or more Boolean functions of two encoded signals using the same encoding function.

41. The method of claim 17 in which a comparison is performed between one or more Boolean functions of two encoded signals using different encoding functions.

42. A volatile or non-volatile computer usable medium comprising instructions for performing a process by a processor for verifying a circuit design, the circuit design having a portion corresponds to an encoded carry-save signal, the process comprising the acts of:
    decoding by a decoder the encoded carry-save signal to produce a decoded carry-save signal;
    determining a correspondence between the decoded carry-save signal of the circuit design and a second signal of a second circuit design;
    comparing the decoded carry-save signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics; and
    storing the decoded carry-save signal or displaying the decoded carry-save signal on a display device.

43. A system for verifying a circuit design, the circuit design having a portion corresponds to an encoded carry-save signal, the system comprising:
    a decoder for decoding the encoded carry-save signal to produce a decoded carry-save signal;
    means for determining a correspondence between the decoded carry-save signal of the circuit design and a second signal of the second circuit design;
    a processor for comparing the decoded carry-save signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics; and
    a volatile or non-volatile computer readable medium for storing the decoded carry-save signal or a display device for displaying the decoded carry-save signal.

44. A volatile or non-volatile computer usable medium comprising instructions for performing a process by a processor for verifying a circuit design, the circuit design having a portion corresponds to an encoded signal, the process comprising the acts of:

decoding by a decoder the encoded signal to produce a decoded signal;

determining a correspondence between the decoded signal of the circuit design and a second signal of the second circuit design;

comparing the decoded signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics, and storing the decoding signal or displaying the decoder signal on a display device.

45. A system for verifying a circuit design, the circuit design having a portion corresponds to an encoded signal, the system comprising:

a decoder for decoding the encoded signal to produce a decoded signal;

a processor for determining correspondence between the decoded signal of the circuit design and a second signal of the second circuit design;

means for comparing the decoded signal to the second signal to perform verification upon the circuit design, in which decoding logic and encoding logic are inserted into one or more paths of the carry-save signal, in which the decoding logic and the encoding logic are explicitly inserted by an actual modification to a circuit representation of the circuit design or are implicitly inserted without actual modification to the circuit representation of the circuit design but causing realization of the encoding and the decoding logics; and a volatile or non-volatile computer readable medium for storing the decoded carry-save signal or a display device for displaying the decoded carry-save signal.

46. The method of claim 42 in which two vectors are used to represent one arithmetic value for the encoded carry-save signal.

47. The system of claim 43 in which two vectors are used to represent one arithmetic value for the encoded carry-save signal.

48. The method of claim 44, further comprising employing one or more pseudo inputs to re-encode the decoded signal, in which the one or more pseudo inputs are unmapped.

49. The system of claim 45, further comprising logic for employing one or more pseudo inputs to re-encode the decoded signal, in which the one or more pseudo inputs are unmapped.

* * * * *

UNITED STATES PATENT AND TRADEMARK OFFICE
CERTIFICATE OF CORRECTION

PATENT NO. : 7,627,842 B1  Page 1 of 1
APPLICATION NO. : 10/859465
DATED : December 1, 2009
INVENTOR(S) : Khoo et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1264 days.

Signed and Sealed this

Second Day of November, 2010

David J. Kappos
*Director of the United States Patent and Trademark Office*